US011874589B2

(12) United States Patent
Mezouari et al.

(10) Patent No.: US 11,874,589 B2
(45) Date of Patent: Jan. 16, 2024

(54) LED BACKLIGHT

(71) Applicant: PLESSEY SEMICONDUCTORS LIMITED, Plymouth (GB)

(72) Inventors: Samir Mezouari, Plymouth (GB); Ahmad Makkaoui, Plymouth (GB); Keith Strickland, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 273 days.

(21) Appl. No.: 17/052,985

(22) PCT Filed: May 15, 2019

(86) PCT No.: PCT/GB2019/051322
§ 371 (c)(1),
(2) Date: Nov. 4, 2020

(87) PCT Pub. No.: WO2019/220102
PCT Pub. Date: Nov. 21, 2019

(65) Prior Publication Data
US 2021/0124247 A1  Apr. 29, 2021

(30) Foreign Application Priority Data
May 15, 2018 (GB) ..................................... 1807874

(51) Int. Cl.
*G03B 21/20* (2006.01)
*G02F 1/1335* (2006.01)
(Continued)

(52) U.S. Cl.
CPC ..... *G03B 21/2033* (2013.01); *G02F 1/13362* (2013.01); *G02F 1/133603* (2013.01);
(Continued)

(58) Field of Classification Search
CPC .............. G03B 21/2033; G03B 21/006; G03B 21/2073; G02F 1/133607; G02F 1/133603; G02F 1/133605; G02F 1/13362
(Continued)

(56) References Cited

U.S. PATENT DOCUMENTS 7,411,735 B2  8/2008  Magarill et al.
7,535,613 B2  5/2009  Baik
(Continued)

FOREIGN PATENT DOCUMENTS

CN  2685930 Y  3/2005
CN  1802588 A  7/2006
(Continued)

OTHER PUBLICATIONS

International Search Report and Written Opinion, PCT/GB2019/051322, dated Aug. 8, 2019, 18 pages.

*Primary Examiner* — Jerry L Brooks
(74) *Attorney, Agent, or Firm* — Stinson LLP

(57) ABSTRACT

An LED backlight for use with a display panel, the backlight comprising a monolithic LED array having a surface and comprising a plurality of LEDs for emitting light from the surface of the array; a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of about +/−50° from a line substantially normal to the surface of the LED array; a microlens array for focusing the collimated light to infinity, the microlens array comprising a plurality of lenslets, each lenslet aligned with a collimating channel of the monolithic collimator array; and a relay lens for focusing the light from the microlens array on a display panel.

19 Claims, 7 Drawing Sheets

(51) Int. Cl.
*G02F 1/13357* (2006.01)
*G03B 21/00* (2006.01)

(52) U.S. Cl.
CPC .. *G02F 1/133605* (2013.01); *G02F 1/133607* (2021.01); *G03B 21/006* (2013.01); *G03B 21/2073* (2013.01)

(58) Field of Classification Search
USPC ............................................................ 353/20
See application file for complete search history.

(56) References Cited

U.S. PATENT DOCUMENTS

| | | | |
|---|---|---|---|
| 8,079,718 | B1 | 12/2011 | Zhai et al. |
| 8,531,771 | B2 | 9/2013 | Reichel et al. |
| 2002/0140906 | A1* | 10/2002 | Gibbon ................ H04N 9/3105 353/31 |
| 2005/0122487 | A1* | 6/2005 | Koyama ................ A47F 11/06 348/E9.027 |
| 2005/0237488 | A1 | 10/2005 | Yamasaki et al. |
| 2006/0018025 | A1 | 1/2006 | Sharon et al. |
| 2006/0268404 | A1 | 11/2006 | Hyobu |
| 2008/0191997 | A1 | 8/2008 | Min et al. |
| 2010/0321640 | A1* | 12/2010 | Yeh ....................... G03B 21/005 353/31 |
| 2012/0050694 | A1 | 3/2012 | Huang et al. |
| 2012/0170002 | A1 | 7/2012 | Ouderkirk et al. |
| 2013/0170203 | A1 | 7/2013 | Cheng et al. |
| 2014/0049734 | A1 | 2/2014 | Erinjippurath et al. |
| 2016/0056354 | A1* | 2/2016 | Shan ..................... H01L 33/641 438/27 |
| 2016/0269698 | A1 | 9/2016 | Gao et al. |
| 2017/0357100 | A1 | 12/2017 | Ouderkirk et al. |

FOREIGN PATENT DOCUMENTS

| | | |
|---|---|---|
| GB | 2464102 A | 4/2010 |
| GB | 2510401 A | 8/2014 |
| JP | 2005165126 A | 6/2005 |
| KR | 20090053435 A | 5/2009 |
| WO | 2010052304 A1 | 5/2010 |
| WO | 2017111801 A1 | 6/2017 |

* cited by examiner

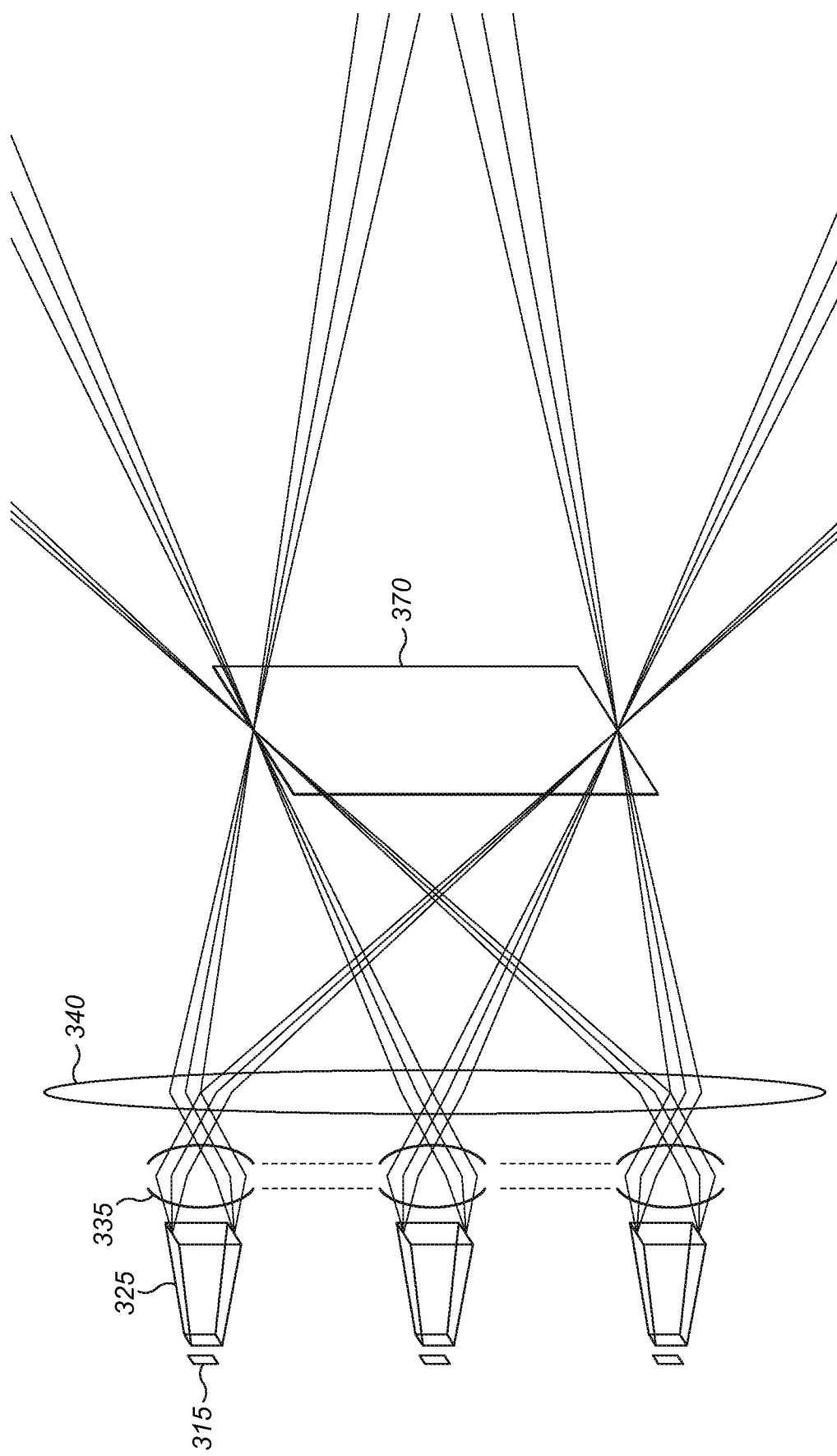

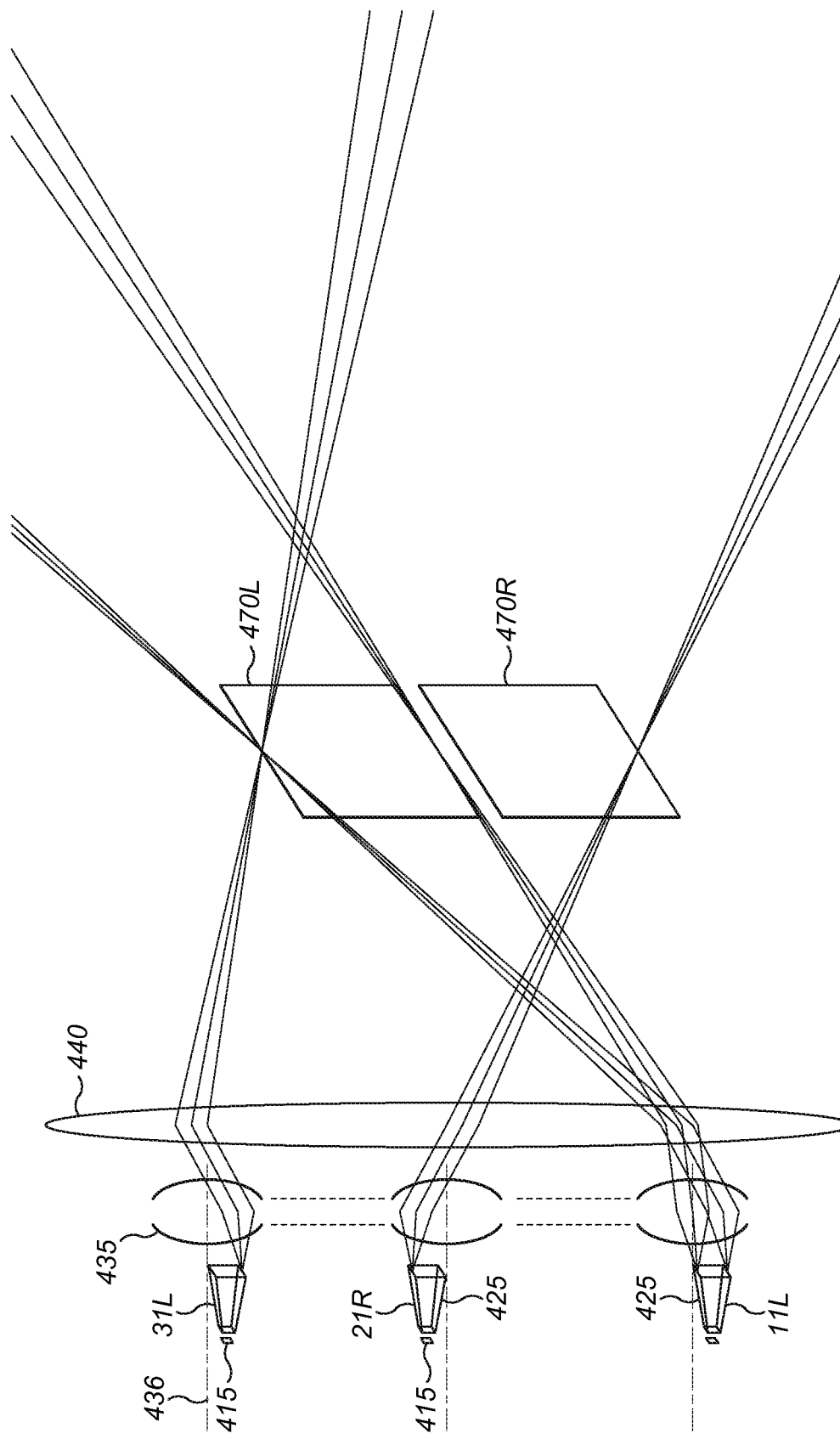

LED BACKLIGHT

REFERENCE TO RELATED APPLICATIONS

This application is a U.S. national stage application based on PCT/GB2019/051322, filed May 15, 2019, claiming priority to Great Britain application no. 1807874.1, filed May 15, 2018, the entire disclosures of which are incorporated herein by reference.

FIELD OF THE INVENTION

The present disclosure relates to an optical illumination device, in particular to an LED backlight for use with a display panel having fewer optical components, reduced size and reduced weight, and the use of the backlight in digital display equipment. Additionally, the device of the present invention allows segmenting or tiling of the illuminated area allowing energy savings when only parts of the full display area are needed.

BACKGROUND

In many applications, such as digital projectors, optical illumination devices must convert structured light sources, such as from an LED or a number of LED's, and convert it into a homogenous or uniform light source in order to provide the illumination to the display panel. The display panel may be an LCoS (Liquid Crystal on Silicon), a MEMS device such as a DMD (Digital Mirror Device), or an LC (Liquid Crystal) panel. Conventional systems use fly's eye lenses or homogenising rods in order to homogenise the light. The use of separate RGB LEDs, rather than a single white LED, as the light source is preferred in many applications. However, this further complicates the illumination device as the individual light sources must be combined into the same optical path.

The demand for portable devices means that, despite the advances in LED technology, lens technology and display panels, there remains a need for illumination devices having a smaller form factor and lower weight. Additionally, the large number of individual components of known devices increases cost of manufacture and can limit durability. Accordingly, there is a desire to provide a simpler illumination device without reducing the brightness or image quality.

Additionally, in some applications of illumination devices only a part of the display area is used at certain periods during device use. For example, heads-up displays and augmented reality devices may only need to provide an image in a small part of display. Conventional devices illuminate the entire display panel even if only a portion of said display panel is needed to produce an image. Such devices therefore use full power even when only producing a partial image. Accordingly, there remains a need for devices which can reduce power usage when only a partial image is required.

US2005237488 relates to an image display technique intended to display images by irradiating light from light sources onto image display elements and forming an optical image.

WO2010052304 relates to an LED light source matrix comprising light source units that have LED light sources, said matrix, in the activated state, illuminating a subsequent microlens array with white light in collimated fashion, wherein a light source unit is associated with a plurality of microlenses that focus the light bundles and direct them through a scattering means located outside the rear focal plane of the microlens array, said scattering means having pre-defined radiating characteristics.

GB2464102 relates to an illumination apparatus comprising a plurality of light-emitting elements aligned to a plurality of optical elements; and a method for fabrication of the illumination apparatus.

WO2017111801 relates to the fabrication of monolithic red, blue and green LEDs using low defect density III-V materials.

KR20090053435 relates to a monolithic light emitting diode array, and more particularly, to a monolithic light emitting diode array having a wiring structure suitable for various connection types such as a series or parallel of light emitting diodes and a method of manufacturing the same.

GB2510401 relates to micro-optical elements for high power diode lasers and in particular, to a monolithic biconvex fast-axis collimator array.

SUMMARY OF THE INVENTION

It is an object of the present invention to provide an improved illumination device which at least one of the problems associated with prior art devices or, at least, provide a commercially useful alternative thereto.

According to a first aspect the present disclosure provides an LED backlight for use with a display panel, the backlight comprising:

a monolithic LED array having a surface and comprising a plurality of LEDs for emitting light from the surface of the array;

a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of about +/−50° from a line substantially normal to the surface of the LED array;

a microlens array for focusing the collimated light to infinity, the microlens array comprising a plurality of lenslets, each lenslet aligned with a collimating channel of the monolithic collimator array; and a relay lens for focusing the light from the microlens array on a display panel.

BRIEF DESCRIPTION OF THE FIGURES

The invention will be described below in relation to the following non-limiting figures. Further advantages of the disclosure are apparent by reference to the detailed description when considered in conjunction with the figures, which are not to scale so as to more clearly show the details, wherein like reference numbers indicate like elements throughout the several views, and wherein:

FIG. 3A shows a ray tracing diagram showing how the LED back light of the present produces homogenised light on a display panel.

FIGS. 4A-4C correspond to FIGS. 3A-3C but show an alternative embodiment where each lenslet is aligned with a single collimator channel and the each collimator channel is offset with respect to the central axis of its associated lenslet.

DETAILED DESCRIPTION OF PREFERRED EMBODIMENTS

Figure 1:
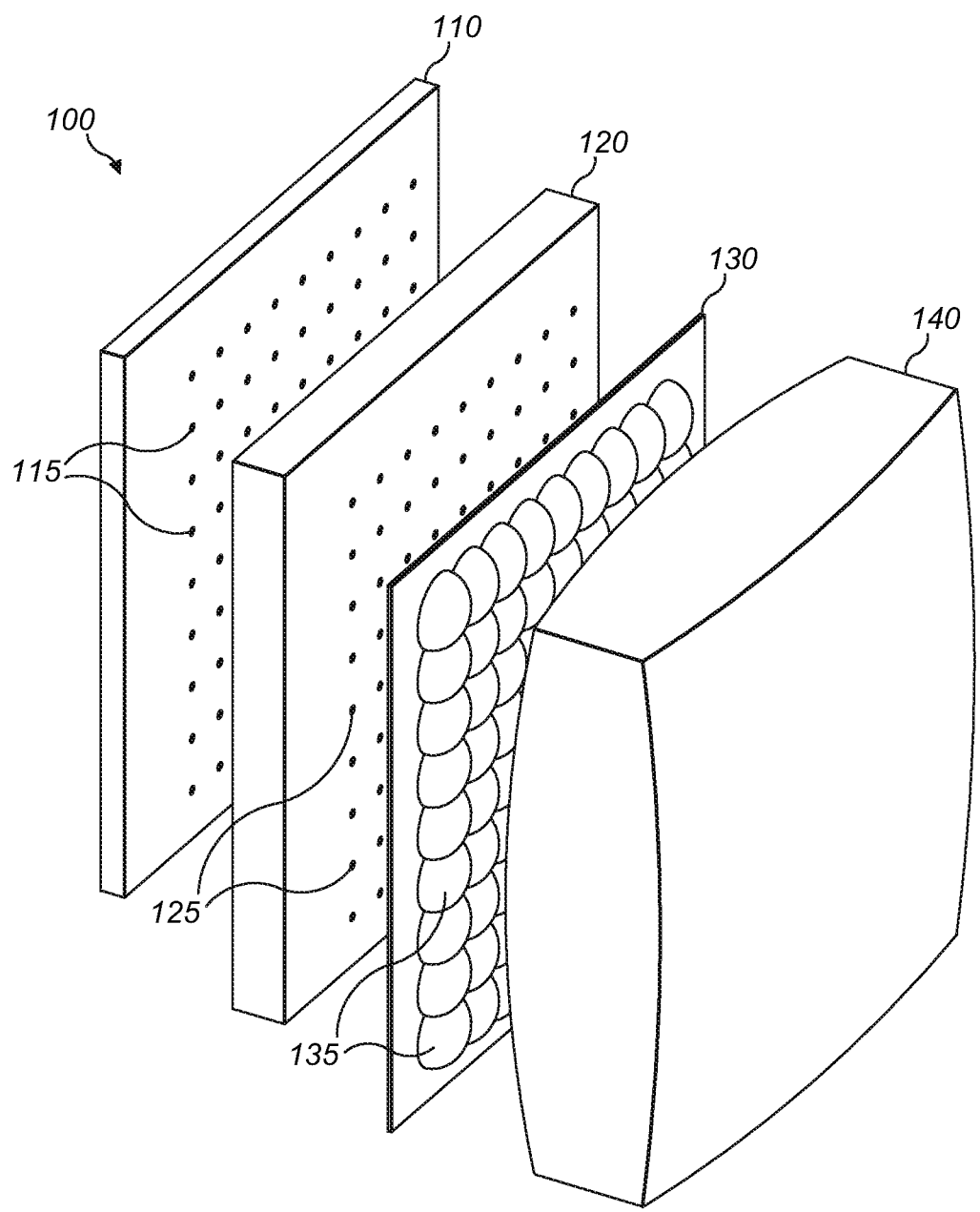
FIG. 1 shows an exploded view of a backlight of the present invention.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The invention relates to an LED backlight for use with a display panel. The LED backlight of the present invention provides a homogenous/uniform light source to a display panel. Advantageously, the backlight of the present invention is smaller and simpler than conventional backlights. In addition, the design means that any dead pixels in the LED array are not visible and simply result in a minor reduction in intensity.

The backlight comprises a monolithic LED array having a surface and comprising a plurality of LEDs for emitting light from the surface of the array. The LED array may include red, green, blue, white LEDs or any combination thereof. A typical LED array comprises at least a 2×2 grid of LEDs, preferably at least a 10×10 grid of LEDs, such as a 100×100 grid of LEDs. A preferred grid would comprise from 4×4 to 8×8 LEDs. It should be noted that the grid does not need to be square.

Each LED may have a different size and form factor. LED manufacture is well known in the art, as are suitable materials and layer structures. Optionally the monolithic LED array may comprise indium gallium nitride and the LEDs may emit light in the range of from 400 to 500 nm (blue light). Optionally phosphor materials can selectively be applied to convert the emitted light into longer wavelengths to achieve colourisation, for example green and red. In this way a range of RGB light can be provided.

Preferably, the monolithic LED array is a monolithic microLED array. The use of a microLED array provides a small form factor and reduced weight of the device. WO2016146658 discloses method of producing LED arrays suitable for the use in the present invention.

The backlight comprises a monolithic collimator array comprising a plurality of collimating channels. The channels are aligned so that each of the collimating channels is aligned with one or more of the plurality of LEDs. This means that the collimating channels are configured to collimate emitted light emitted from the LEDs. That is, the collimating channel is arranged so that at least some light from each LED aligned with the channel passes through the channel. The collimation is to angles in the range of about +/−50° from a line substantially normal to the surface of the array.

Preferably the collimating channels are configured to collimate emitted light emitted from the LEDs to angles in the range of about +/−40°, preferably +/−30°, preferably +/−20°. In view of the complexity of manufacturing the collimator channels and a desire to use more of the LED-emitted light, +/−30° is a good compromise. A smaller angle range of the collimated light reduces cross talk between light from adjacent collimator channels and may allow improved efficiency of the device.

Preferably each collimator channel is aligned with a single LED, preferably a red, green, blue or white LED.

Preferably each channel of the monolithic collimator has an internal surface, the internal surface having a specular (mirror-like) finish and a surface roughness ($S_q$) of less than 20 nm and/or wherein the internal surface has a reflective coating thereon. Preferably, where present, the reflective coating is a metallic coating, such as silver or aluminium, preferably PVD deposited silver. Low surface roughness increases the efficiency of the device as it maximises the useful emission of light. Similarly, a reflective coating on the internal surface of the collimator channels may further increase the efficiency. Accordingly, low surface roughness and a reflective coating are preferred where power usage is a key consideration, such as where the backlight is for use in a portable device with limited power supply.

Surface roughness of the internal surface of a collimator channel may be characterized by image analysis using a 3D optical microscope or indirectly characterized by measurement of the emission angle from the collimator.

To measure the surface roughness using image analysis, a collimator array is potted in a block of hardened epoxy in order to perform a precise and clean cross-section through at least one channel. Using a 3D optical microscope (such as a Bruker 3D Microscope Contour GT-1) the exposed inner surface cross-section is accurately measured and its surface roughness Sq is derived.

A second method uses the emission angle from the collimator array to verify indirectly its surface finish. When surface roughness is greater than 20 nm the cut-off emission angle of light exiting the collimator array will be higher than the expected (computed) value. In addition, the optical efficiency of the collimator array will also decrease because of the increase in the number of light reflections inside each collimator channel due to the roughness of the internal surfaces.

The spatial radiation pattern of the emitted light from the collimator may be determined using an LEDGON goniophotometer from Instrument Systems. The measurement is made with a high angle resolution of 0.2° to give precise measurements to correlate with the simulation data.

Preferably each collimator channel comprises a tapered micro-cavity. The taper angle may be constant or varied. A constant taper (i.e. flat sides) allows for easier manufacture of the collimator array. Preferably the micro-cavity has a compound parabolic shape comprising four tapered walls having rectangular entrance and exit apertures at distal ends. Most preferably the entrance and exit apertures are square.

The monolithic collimator array may be produced by any appropriate means. For example, the monolithic collimator array may be produced by injection moulding, additive manufacturing or nanolithography. Injection moulding is especially preferred due to the speed of manufacture and because it can be used to achieve a reasonable surface roughness.

If injection moulded, the monolithic collimator may be formed of any thermoplastic with good moulding and physical vapour deposition (PVD) coating properties, such as polycarbonate.

Suitable polymers for additive manufacturing include PEEK (Polyetheretherketone) and PEKK (Polyetherketoneketone). PEEK is considered an advanced biomaterial most often used in medical implants and PEKK is a semicrystalline thermoplastic in the polyaryletherketone (PAEK) family, with high heat resistance, chemical resistance and the ability to withstand high mechanical loads.

The collimator array can also be fabricated using a single lithographic step with a silicon oxide ($SiO_2$) hard mask at a silicon wafer scale. Two approaches can be used for the fabrication. The first one involves a single wet anisotropic etch step in concentrated potassium hydroxide (KOH) and the second is a combined approach comprising Deep Reactive Ion Etch (DRIE) followed by wet anisotropic etching.

The backlight comprises a microlens array for focusing the collimated light on infinity, the microlens array comprising a plurality of lenslets, each lenslet aligned with a collimating channel of the monolithic collimator array. Microlens arrays are well known and may also be known as a lenslet arrays or fly's eye lens.

The microlens array of the present disclosure is formed of a transparent material, preferably polycarbonate or acrylic. Preferably the lenslet surfaces have a surface roughness $S_q$ of less than 10 nm. Low surface roughness of the lens surface minimises or prevents light scattering improving the device efficiency.

Optionally the microlens array may be coated with an anti-reflection layers in order to reduce optical losses due to Fresnel reflections.

The backlight comprises a relay lens for focusing the light from the microlens array on a display panel. The combination of the microlens array and relay lens homogenise, magnify and focus the light from the collimating channels onto the display panel.

Advantageously, the backlight of the present invention requires only a single microlens array and does not require collectors or dichroic combiners as required in known backlights.

In various embodiments of the present invention each lenslet may be aligned with one or more collimator channels, and a central axis of the lenslet may be aligned with or offset from a central axis of the one or more collimator channels. Specifically, each lenslet of the microlens array is aligned with:
  a) a single collimator channel, wherein a central axis of the collimator channel and a central axis of the lenslet are aligned; or
  b) one or more collimator channels, wherein a central axis of each of the one or more collimator channels are offset from a central axis of the lenslet; or
  c) a combination of (a) and (b).

Where the central axis of a lenslet and a collimator channel are aligned as in (a) above, in use, light from the collimator channel illuminates substantially the entirety of the display panel. That is, each LED is providing light across the entirety of the display panel. This is why the device is able to cope with dead LEDs with only a minor drop in light intensity.

Where the central axis of a lenslet and a collimator channel are offset, in use, light from the collimator channel illuminates a defined portion of the display panel.

Preferably the monolithic collimator array comprises at least first and second sub-arrays of collimator channels, wherein each collimator channel in the first sub-array of collimator channels is identically offset from the central axis of the corresponding lenslet and each collimator channel in the second sub-array of collimator channels is identically offset from the central axis of the corresponding lenslet, whereby selective actuation of the LEDs aligned with the first or second sub-array of collimator channels would provide illumination on non-identical portions of a display panel. It should be appreciated that in this embodiment each sub-array may comprise as few as one collimator channel.

Advantageously, such an arrangement of LEDs, collimator channels and lenslets allows the selective illumination of defined portions of the display panel by actuation of a portion of the LEDs whilst still providing a bright source of homogenised light. Accordingly, when an image is only needed over a portion of the display panel a portion of the LEDs may be switched off providing a corresponding saving in energy.

For example, the backlight of the present invention may be used in a heads-up display unit where a full screen image may be needed some of the time and an image only on one portion, such as the bottom or one side of the screen, is needed some of the time. When an image is only required on one portion of the screen, LEDs corresponding to other portions may be switched off.

A further advantage of the present invention is provided by the effective redundancy of the LEDs in the LED array. In known backlights a single red, green, blue or white LED may be used to illuminate the whole display panel. If a single LED fails, the device may be rendered non-functional and require replacement of the LED.

Conversely, in the present invention an array of LEDs corresponds to the whole screen or a portion thereof. Accordingly, failure of a single LED merely leads to a dimming of the backlight or portion thereof. Arrays of the present invention may include a large number of LEDs and the dimming due to failure of a single LED would therefore be negligible.

Optionally the monolithic LED array and the monolithic collimator array are integrally formed. Advantageously, this may provide a more robust device and reduce the number of alignment steps needed in a manufacturing process.

Preferably the LED array is a microLED array. Use of a microLED array provides a device with a smaller form factor suitable for use in smaller final products such as portable devices. Use of a microLED array may also allow an increased number of individual LEDs for a given portion of the display panel increasing the redundancy and therefore the reliability of the device.

Preferably the monolithic collimator array has a depth of from 100 to 2000 microns. This provides a collimator suitable for use with a microLED array. The depth corresponds to the length of the collimator along the central axis of each collimator channel.

In a further aspect the present disclosure provides an LED illumination device for forming the LED backlight described herein, the device comprising:
  a monolithic LED array having a surface and comprising a plurality of LEDs for emitting light from the surface of the array;
  a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of about +/−50° from a line substantially normal to the surface of the LED array; and
  a microlens array for focusing the collimated light to infinity, the microlens array comprising a plurality of lenslets, each lenslet aligned with a collimating channel of the monolithic collimator array. The LED illumination device of the present disclosure provides a precursor for the LED backlight of the present disclosure.

The LED backlight or the LED illumination device of the present disclosure may further comprise a polariser. Polarisers are well known in the art. A polariser may be used to polarise the focused collimated light before it is focused by the relay lens or may be used to polarise the focused light after it has been focused by the relay lens.

Accordingly, where present, in the LED backlight of the present disclosure, a polariser may be placed between the microlens array and the relay lens or after the relay lens as the last component in the optical path. Alternatively, where present in an LED illumination device of the present invention the polariser may be placed after the microlens array as the last component in the optical path. Inclusion of a polariser in the devices of the present invention may be useful in some applications, such as when the backlight or illumination device is to be used with an LCoS or LC display panel.

In a further aspect the present disclosure provides a digital light projector comprising the LED backlight of the first aspect and a display panel. This corresponds to the LED illumination device described above, combined with a relay lens and a display panel. Preferably the display panel is arranged at a separation from the relay lens such that substantially all light from the LED backlight is incident on the display panel. Such an arrangement maximises the efficiency of the device.

In a further aspect the present disclosure provides use of a monolithic collimator array for collimating light from a monolithic LED array in an LED backlight. All elements of the other aspects discussed herein may be freely combined with this aspect.

In a preferred embodiment of the first aspect, there is provided an LED backlight for use with a display panel, the backlight comprising:

a monolithic LED array having a surface and comprising a plurality of LEDs arranged to emit light from the surface of the array;

a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of about +/−50° from a line substantially normal to the surface of the LED array;

a microlens array arranged to focus the collimated light to infinity, the microlens array comprising a plurality of lenslets, each lenslet aligned with a collimating channel of the monolithic collimator array; and a relay lens arranged to focus the light from the microlens array on a display panel.

The exploded view of backlight (100) of FIG. 1 comprises a monolithic LED array (110) having a plurality of microLEDs (115); a monolithic collimator array (120) having a plurality of collimator channels (125); a microlens array (130) having a plurality of lenslets (135); and a relay lens (140).

In use, light emitted from the plurality of microLEDs (115) is collimated through the collimator channels (125) of the monolithic collimator array (120). The light from each channel (125) passes into a lenslet (135) of the microlens array (130). This focusses the light to infinity. The light then passes to a relay lens (140). The relay lens then focuses the light towards a display screen (not shown in FIG. 1).

Figure 2A:
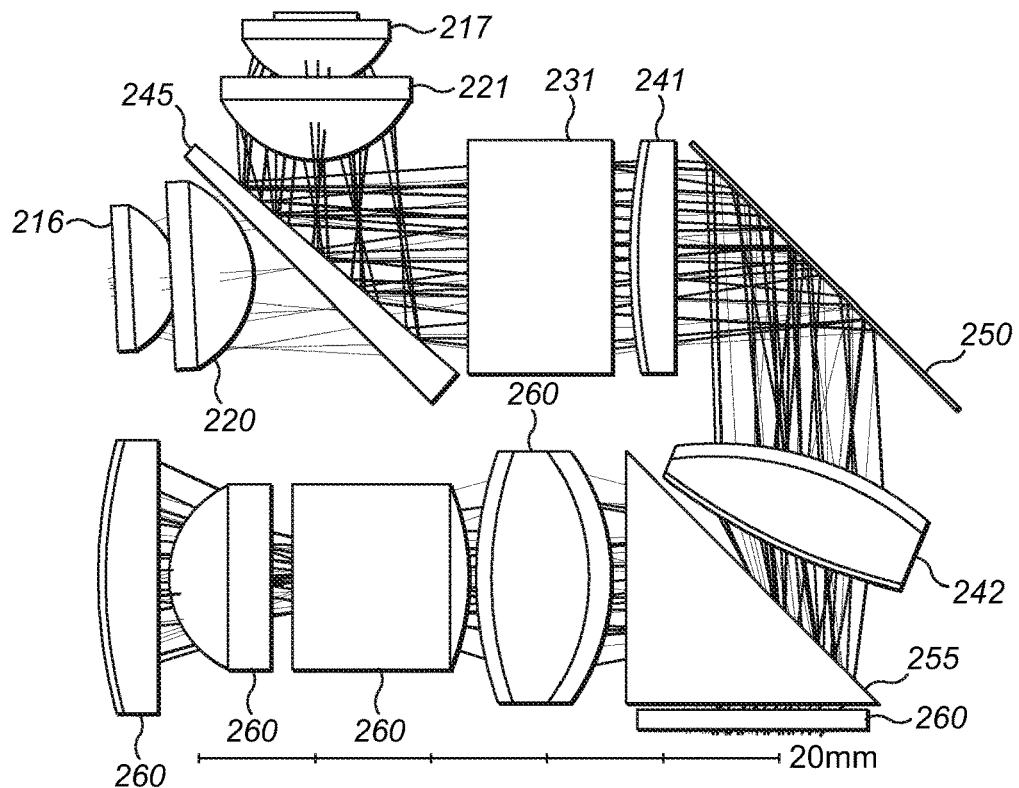
FIG. 2A shows a prior art projection optical system comprising a conventional LED backlight comprising a green LED and a combined blue and red LED.

The prior art projection optical system of FIG. 2A comprises a green LED (216) and a combined red/blue LED (217), collimators (220, 221) associated with each of the LEDs (216, 217), a dichroic mirror (245), a fly's eye lens array (231), a first relay lens (241), a mirror (250), a second relay lens (242), a total internal reflection prism (255), a digital micro mirror device (260) and a projection lens apparatus (260). In the projection optical system of FIG. 2B the LEDs (216, 217), the collimators (220, 221), the dichroic mirror (245), the lens array (231) and first relay lens (241) have been replaced by an LED backlight of the present disclosure (200 and 241).

Figure 2B:
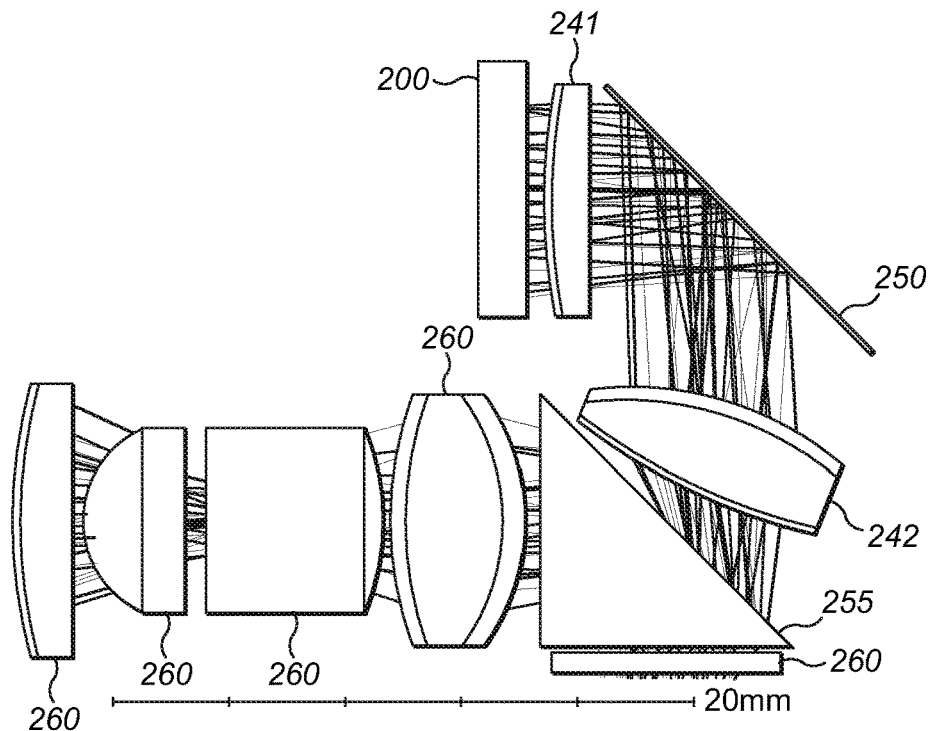
FIG. 2B shows a projection optical system incorporating the LED backlight of the present disclosure.

As shown by FIGS. 2A and 2B, the LED backlight of the present invention reduces the number of individual optical parts necessary in a projection optical system. Additionally, although the figures are not to scale, it is clear that the backlight of the present invention has a reduced form factor compared for prior art systems. Accordingly, the LED backlight of the present disclosure allows for smaller, lighter and simpler devices.

FIG. 3A shows a ray tracing diagram of an embodiment of the LED backlight of the present disclosure wherein each collimator channel (325) is aligned with a single LED (315) and each lenslet (335) is aligned with a single collimator channel (325), and wherein the central axis (not shown) of each lenslet (335) is aligned with the central axis of the corresponding collimator channel (325).

In the embodiment of FIG. 3A the emitted light from each individual LED (315) is of Lambertian distribution (180-degree emission angle). The light emitted from an LED (315) passes through the associated collimator channel (325) and is thereby collimated. After collimation, the emerging light at exit aperture has a narrower angular distribution. Specifically, the cut-off emission angle from exit aperture is not greater than 50 degrees and is preferably about 30 degrees.

The collimated light exiting a given collimator channel (325) is refracted by the associated lenslet (335) to form an image of the exit aperture of the collimator channel (335) focused on infinity. Relay lens (340) focuses the image of exit aperture onto the display panel (370). Since the central axes of the associated lenslets and collimator channels are aligned, the light from each collimator channel (325) in the array is focused by the relay lens (340) onto the same planar area of the display panel (370).

Figure 3B:
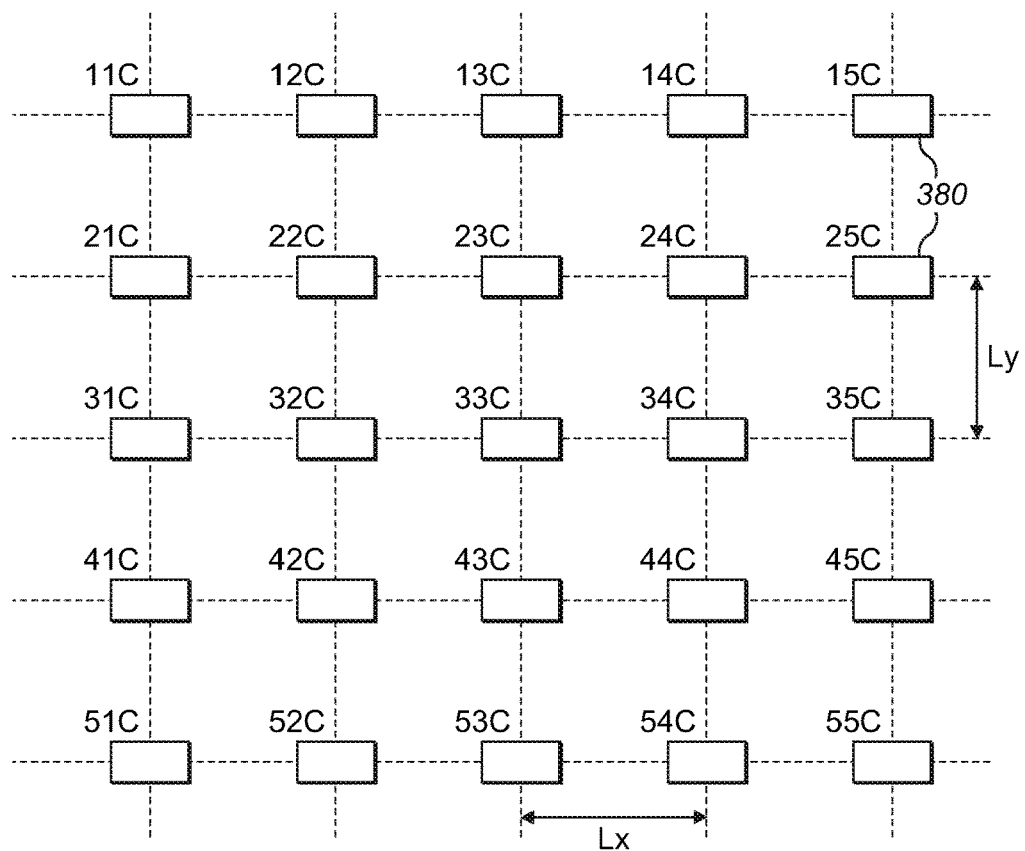
FIG. 3B shows a schematic of the exit apertures of the collimator array of this embodiment.
Figure 3C:
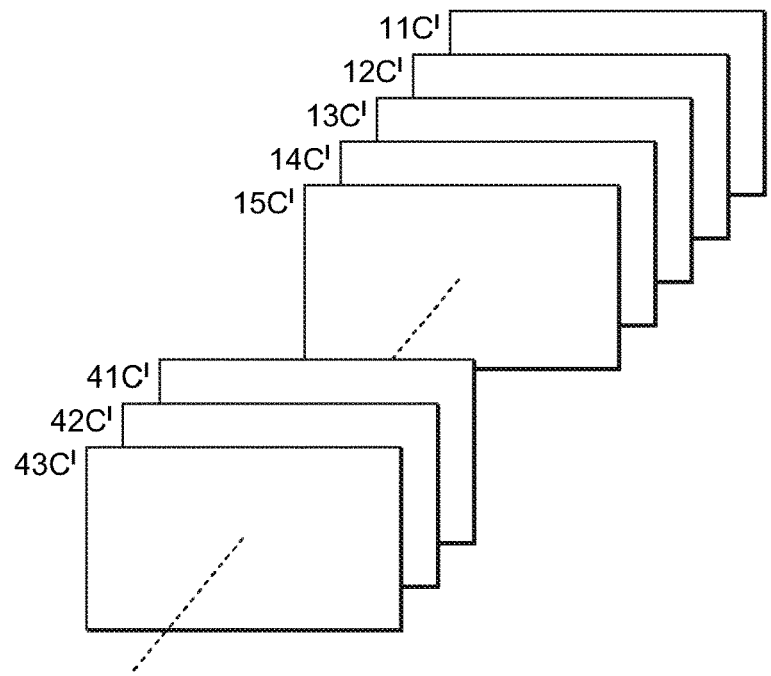
FIG. 3C illustrates the superposition of the light from each of the collimators of the array of FIG. 3B.

FIG. 3B shows a schematic of a collimator array according to FIG. 3A, where intersections of gridlines show the central axis of lenslets. FIG. 3C illustrates the superposition of the light from each collimator channel onto the same planar area.

FIG. 4 shows a ray tracing diagram of another embodiment wherein each lenslet (435) is aligned with a single collimator channel (425). However, unlike the embodiment of FIG. 3 where each collimator channel (325) is aligned with the central axis of the associated lenslet (335), in this embodiment each collimator channel (425) is offset from central or optical axis (436) of the associated lenslet (435). Specifically, adjacent collimators are offset, with respect to the central axis (436) of their associated lenslet (435), by the same distance but in the opposite direction. The collimators are labelled with their grid position and an L or an R to indicate their offset from the associated lenslet optical axis.

Figure 4B:
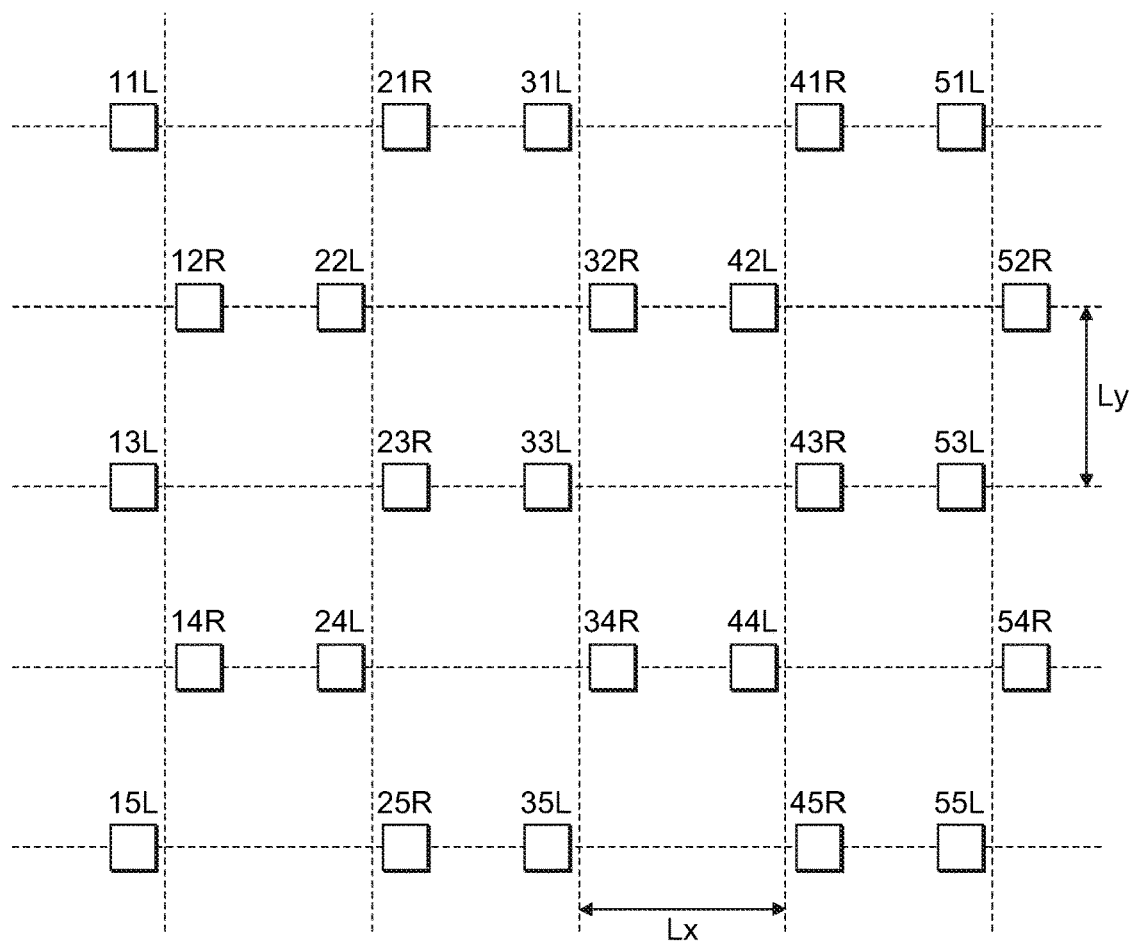
Figure 4C:
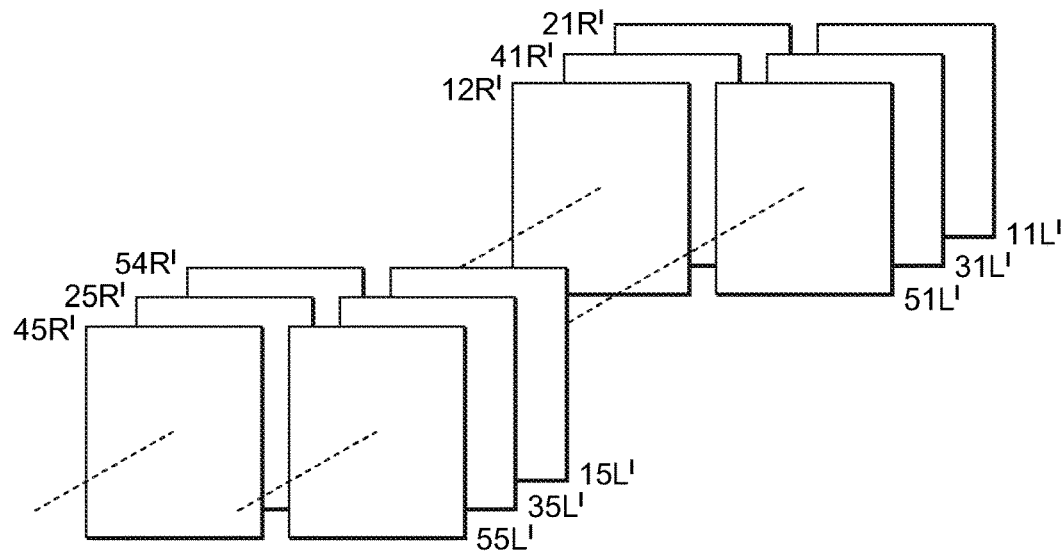

A top down view of a portion of the collimator array of this embodiment is shown in FIG. 4B, as with FIG. 3B intersections of the gridlines show the central axis of the associated lenslet. An illustration of the superposition of the light from the LEDs is shown in FIG. 4C. It would be appreciated by the skilled person that while gaps are shown between the illumination "tiles" on the display panel this is for clarity. These could be made contiguous or separate by adjustment of the configuration of the components of the backlight of the invention, such as by adjustment of the lens design.

The embodiment of FIG. 4 provides tiled illumination of the display panel. Switching on alternating LEDs will illuminate one portion of the panel or the other. It will be understood by the skilled person that the specific array of illustrated in FIG. 4 is only illustrative. The position of a given LED-collimator-lenslet combination in the array does not affect the portion of the display panel illuminated. Rather it is the arrangement of the collimator with respect to the lenslet that controls which portion of the display panel is illuminated.

This allows significant flexibility with regards to the design of the LED backlight. For example, the LED array may be arranged into three regions of red, blue and green LEDs respectively allowing for easier application of phosphors or other layers in the LED structure during production. Each of the coloured sections may then be separated into subsections where the collimators in a given subsection all have the same offset with respect to their lenslet axis potentially allowing for simpler wiring of the LED array.

Figure 5:
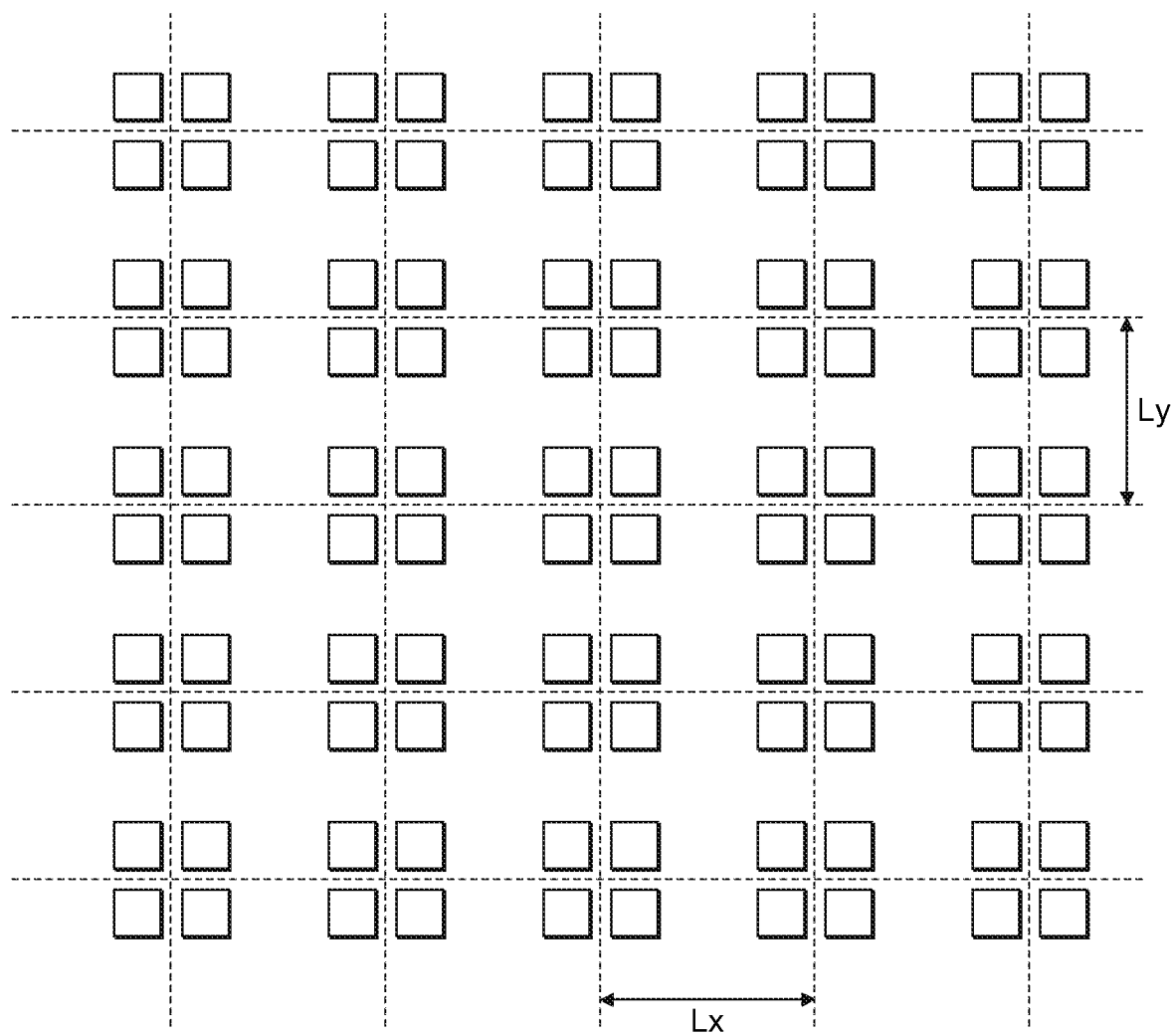
FIG. 5 shows a further embodiment where each lenslet is aligned with a 2×2 grid of collimator channels.

FIG. 5 shows a further embodiment where each lenslet is aligned with a 2×2 grid of LEDs. This arrangement would provide selective 2×2 tiling illumination of the display panel.

It will be appreciated by the skilled person that the various embodiments discussed above may be combined in a single LED backlight. For example a portion of the device may be arranged as in FIG. 3 to provide illumination across the entirety of the display panel while other portions have one or more collimators aligned with each lenslet in order to illuminate non-identical portions of the display panel.

The invention claimed is:

1. An LED backlight for use with a display panel, the backlight comprising:
   a monolithic LED array having a surface and comprising a plurality of LEDs for emitting light from the surface of the monolithic LED array;
   a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of −50° to +50° from a line substantially normal to the surface of the LED array;
   a microlens array configured to focus the collimated light to infinity, the microlens array comprising a plurality of lenslets, each lenslet aligned with a collimating channel of the monolithic collimator array; and
   a relay lens for focusing the light from the microlens array on a display panel.

2. The LED backlight according to claim 1, wherein each collimator channel is aligned with a single LED, preferably a red, green, blue or white LED.

3. The LED backlight according to claim 1, wherein each lenslet of the microlens array is aligned with:
   a) a single collimator channel, wherein a central axis of the collimator channel and a central axis of the lenslet are aligned; or b) one or more collimator channels, wherein a central axis of each of the one or more collimator channels are offset from a central axis of the lenslet; or c) a combination of (a) and (b).

4. The LED backlight according to claim 1, wherein each lenslet of the microlens array is aligned with one or more collimator channels, wherein a central axis of each of the one or more collimator channels are offset from a central axis of the lenslet.

5. The LED backlight according to claim 3, wherein the monolithic collimator array comprises at least first and second sub-arrays of collimator channels, wherein each collimator channel in the first sub-array of collimator channels is identically offset from the central axis of the corresponding lenslet and each collimator channel in the second sub-array of collimator channels is identically offset from the central axis of the corresponding lenslet, whereby selective actuation of the LEDs aligned with the first or second sub-array of collimator channels would provide illumination on non-identical portions of a display panel.

6. The LED backlight according to claim 1, wherein the monolithic LED array and the monolithic collimator array are integrally formed.

7. The LED backlight according to claim 1, wherein the LED array is a microLED array.

8. The LED backlight according to claim 1, wherein the collimating channels are configured to collimate emitted light emitted from the LEDs to angles in the range of about +/−40°, preferably +/−30°, preferably +/−20°.

9. The LED backlight according to claim 1, wherein the monolithic collimator has a depth of from 100 to 2000 microns.

10. The LED backlight according to claim 1, wherein each channel of the monolithic collimator has an internal surface, the internal surface having a surface roughness ($S_q$) of less than 20 nm and/or wherein the internal surface has a reflective coating thereon.

11. The LED backlight according to claim 10, wherein the internal surface has a reflective coating which is a metallic coating, such as PVD deposited silver.

12. The LED backlight according to claim 1, wherein the monolithic collimator is injection moulded.

13. The LED backlight according to claim 1, wherein the monolithic collimator is made using nanolithography.

14. The LED backlight according to claim 1, further comprising a polariser.

15. A digital light projector comprising the LED backlight of claim 1 and a display panel.

16. The digital light projector according to claim 15, wherein the display panel is arranged at a separation from the relay lens such that substantially all light from the LED backlight is incident on the display panel.

17. An LED illumination device for forming an LED backlight, the device comprising:
   a monolithic LED array having a surface and comprising a plurality of LEDs for emitting light from the surface of the array;
   a monolithic collimator array comprising a plurality of collimating channels, and being aligned so that each of the collimating channels is aligned with one or more of the plurality of LEDs, wherein the collimating channels are configured to collimate emitted light emitted from the LEDs to angles in the range of about +/−50° from a line substantially normal to the surface of the LED array; and
   a microlens array for focusing the collimated light to infinity, the microlens array comprising a plurality of lenslets, each lenslet aligned with a collimating channel of the monolithic collimator array.

18. The LED illumination device according to claim 17, further comprising a polariser.

19. The LED illumination device of claim 17 in combination with a display panel incorporated into a digital light projector.

* * * * *